United States Patent
Chiang et al.

(10) Patent No.: US 8,980,709 B2
(45) Date of Patent: Mar. 17, 2015

(54) RESISTIVE-SWITCHING MEMORY ELEMENT

(71) Applicant: Intermolecular, Inc., San Jose, CA (US)

(72) Inventors: Tony P. Chiang, Campbell, CA (US); Chi-I Lang, Cupertino, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/028,281

(22) Filed: Sep. 16, 2013

(65) Prior Publication Data

US 2014/0014892 A1 Jan. 16, 2014

Related U.S. Application Data

(60) Continuation of application No. 13/624,374, filed on Sep. 21, 2012, now Pat. No. 8,563,959, which is a division of application No. 12/603,510, filed on Oct. 21, 2009, now Pat. No. 8,298,891.

(60) Provisional application No. 61/235,321, filed on Aug. 19, 2009, provisional application No. 61/234,214, filed on Aug. 14, 2009.

(51) Int. Cl.
H01L 21/336 (2006.01)
H01L 45/00 (2006.01)
H01L 27/24 (2006.01)

(52) U.S. Cl.
CPC ............... *H01L 45/14* (2013.01); *H01L 45/10* (2013.01); *H01L 45/1233* (2013.01); *H01L 45/1253* (2013.01); *H01L 45/149* (2013.01); *H01L 45/1608* (2013.01); *H01L 45/1616* (2013.01); *H01L 45/1641* (2013.01); *H01L 27/2463* (2013.01)
USPC .............................. 438/257; 438/393; 438/95

(58) Field of Classification Search
None
See application file for complete search history.

(56) References Cited

U.S. PATENT DOCUMENTS 7,541,633 B2 * 6/2009 Lee et al. ...................... 257/296

* cited by examiner

*Primary Examiner* — Jack Chen

(57) ABSTRACT

A resistive-switching memory element is described. The memory element includes a first electrode, a porous layer over the first electrode including a point defect embedded in a plurality of pores of the porous layer, and a second electrode over the porous layer, wherein the nonvolatile memory element is configured to switch between a high resistive state and a low resistive state.

19 Claims, 8 Drawing Sheets

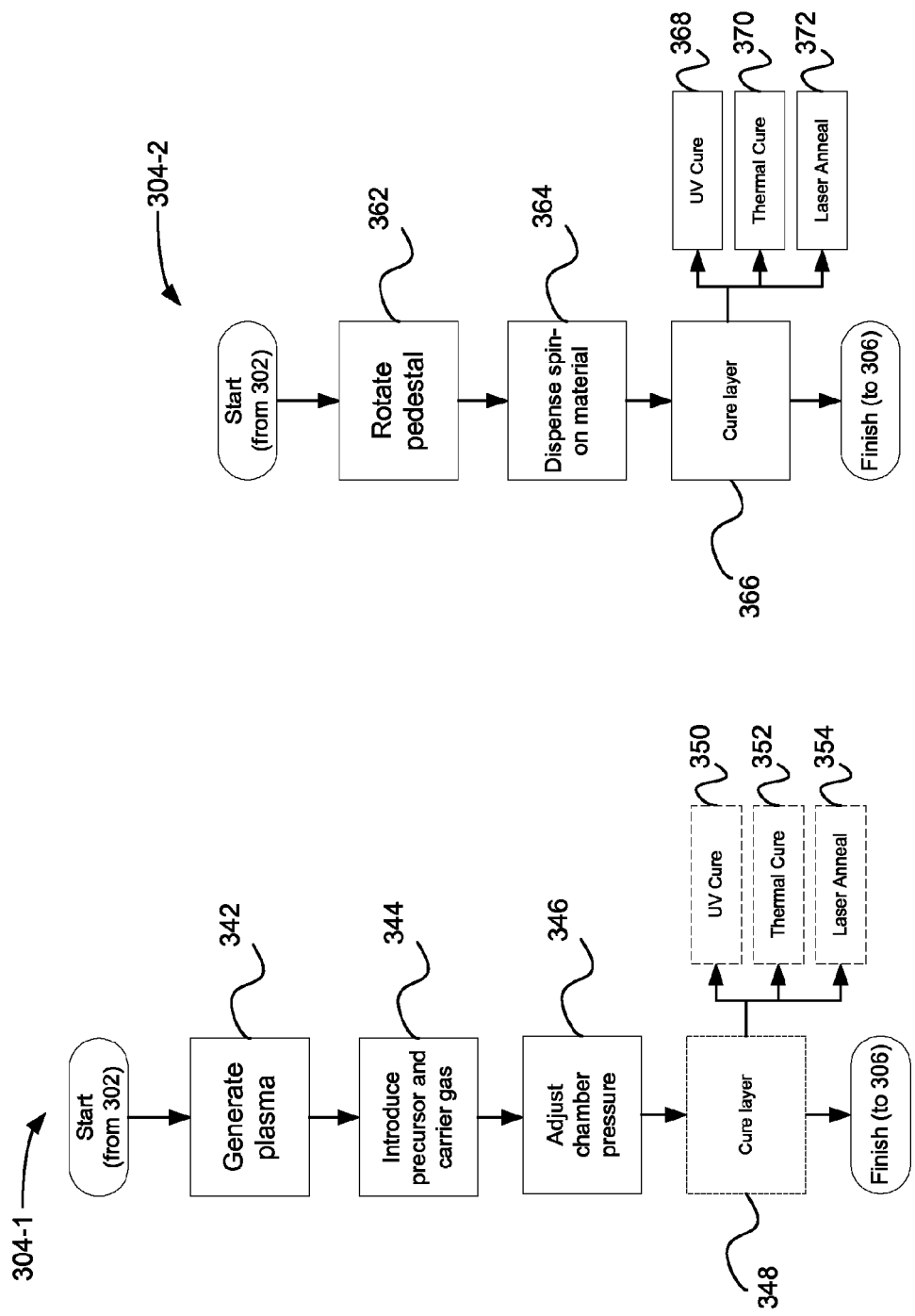

RESISTIVE-SWITCHING MEMORY ELEMENT

PRIORITY CLAIM TO RELATED APPLICATIONS

This application is a Continuation application of U.S. patent application Ser. No. 13/624,374, entitled "RESISTIVE-SWITCHING MEMORY ELEMENT" and filed on Sep. 21, 2012, which is a Divisional application of U.S. patent application Ser. No. 12/603,510, entitled "RESISTIVE-SWITCHING MEMORY ELEMENT" and filed on Oct. 21, 2009, which is issued as U.S. Pat. No. 8,298,891 on Oct. 30, 2012, both of which are incorporated herein by reference, and which further claims priority under the provisions of 35 U.S.C. §119 based upon U.S. Provisional Application No. 61/235,321 entitled "RESISTIVE-SWITCHING MEMORY ELEMENT" and filed on Aug. 19, 2009, which is incorporated herein by reference and based upon U.S. Provisional Application No. 61/234,214 entitled "RESISTIVE-SWITCHING MEMORY ELEMENT" and filed on Aug. 14, 2009, which is incorporated herein by reference.

FIELD OF THE INVENTION

The present invention relates generally to semiconductor memories. More specifically, a resistive-switching memory element is described.

BACKGROUND OF THE INVENTION

Nonvolatile memories are semiconductor memories that retain their contents when unpowered. Nonvolatile memories are used for storage in electronic devices such as digital cameras, cellular telephones, and music players, as well as in general computer systems, embedded systems and other electronic devices that require persistent storage. Nonvolatile semiconductor memories can take the form of removable and portable memory cards or other memory modules, can be integrated into other types of circuits or devices, or can take any other desired form. Nonvolatile semiconductor memories are becoming more prevalent because of their advantages of small size and persistence, having no moving parts, and low power consumption.

Flash memory is a common type of nonvolatile memory used in a variety of devices. Flash memory has an architecture that can result in long access, erase, and write times. The operational speeds of electronic devices and storage demands of users are rapidly increasing. Flash memory is proving, in many instances, to be inadequate for nonvolatile memory needs. Additionally, volatile memories (such as random access memory (RAM)) can potentially be replaced by nonvolatile memories if the speeds of nonvolatile memories are increased to meet the requirements for RAM and other applications currently using volatile memories.

Thus, what is needed is a new type of nonvolatile memory. Memories that include elements which exhibit changes in resistive states in response to the application of voltages have been described. These memories typically have operational and durability limitations. Therefore, a resistive-switching memory with improved operational and durability characteristics is desired.

BRIEF DESCRIPTION OF THE DRAWINGS

Various embodiments of the invention are disclosed in the following detailed description and the accompanying drawings:

FIGS. 3A-3C are flowcharts describing a process for forming a resistive-switching memory element including a porous layer having a conductive precursor dispersed throughout;

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a metal-insulator-metal (MIM) style resistive-switching memory element is described. The memory element includes two conductive electrodes surrounding a resistive-switching porous layer that is infused with a conductive vapor-based deposition precursor and then annealed to create point defects embedded in the pores of the porous layer. For example, the porous layer can include an insulating material (e.g. C), a semiconductor material (e.g. Si), or a mixture of insulating and semiconductor materials that is formed into a porous matrix into which a precursor molecule can be flowed (i.e. diffused) and attach to the pores thereof. The precursors could be metal- (e.g. Hf, Ti, Ru, Ni to create conductive point defects) or semiconductor- (e.g. Si, Ge to create semiconducting point defects) based precursors. When the precursor molecules are flowed into the porous layer, the molecules fill the pores, and using the process described herein, are spatially distributed throughout the porous layer. The memory element is then annealed, which breaks the bonds of the precursor molecule (separating the molecule into the metal or semiconductor atom and surrounding volatile components (e.g. methyl, chlorine)), removes the volatile compounds from the layer, and bonds the metal or semiconductor atom of the to the pores of the porous layer.

I. Memory Structure

Figure 1A:
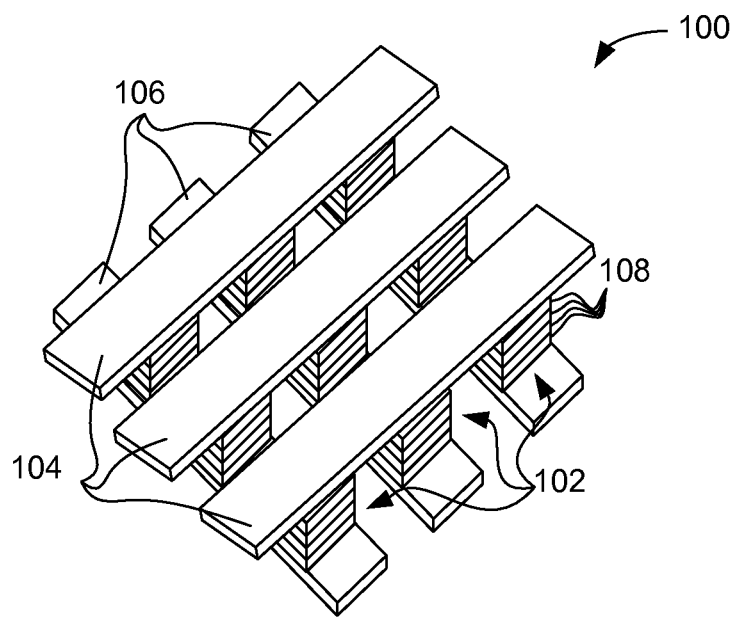
FIG. 1A illustrates a memory array of resistive switching memory elements.

FIG. 1A illustrates a memory array 100 of resistive switching memory elements 102. Memory array 100 may be part of a memory device or other integrated circuit. Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a nonvolatile memory device from resistive switching memory elements such as element 102. For example, horizontal and vertical lines 104 and 106 may be connected directly to the terminals of resistive switching memory elements 102. This is merely illustrative.

If desired, other electrical devices may be associated (i.e., be one or more of the layers 108) with each memory element 102. These devices, which are sometimes referred to as select elements, may include, for example, diodes, p-i-n diodes, silicon diodes, silicon p-i-n diodes, transistors, etc. Select elements may be connected in series in any suitable locations in memory element 102.

Figure 1B:
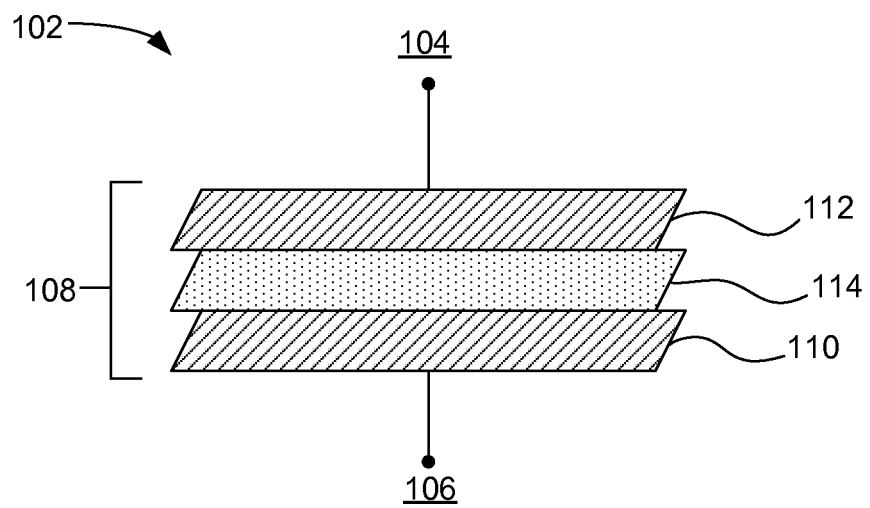
FIG. 1B illustrates a memory element formed using a metal-insulator-metal (MIM) structure.

FIG. 1B illustrates a memory element 102 formed using a metal-insulator-metal (MIM) structure. The memory element includes, for example, two conductive electrodes 110 and 112, and a resistive-switching layer 114. The conductive electrodes 110 and 112 can be any conductive material, including metals and semiconductor materials (e.g. doped silicon). In some embodiments, the conductive electrodes 110 and 112 can be different materials, for example materials that have different work functions. The resistive-switching layer 114 is a porous layer formed from an insulating or semiconductor material that changes from a low resistive state (LRS) to a high resistive state (HRS), and vice versa, upon the application of a voltage. For example, the resistive-switching layer 114 can be a porous layer that includes point defects that are created by infusing a conductive vapor-based precursor into the layer. The point defects are created by annealing to bind the central atom of the precursor molecule to the pore. In some embodiments, as described above, other layers 108 (e.g. select elements such as diodes), additional electrodes, etc. can be interspersed amongst the layers 110, 112, and 114. The point defects can be conductive (e.g. when made by a metal precursor) or semiconducting (e.g. when made by a semiconductor precursor).

Figure 1C:
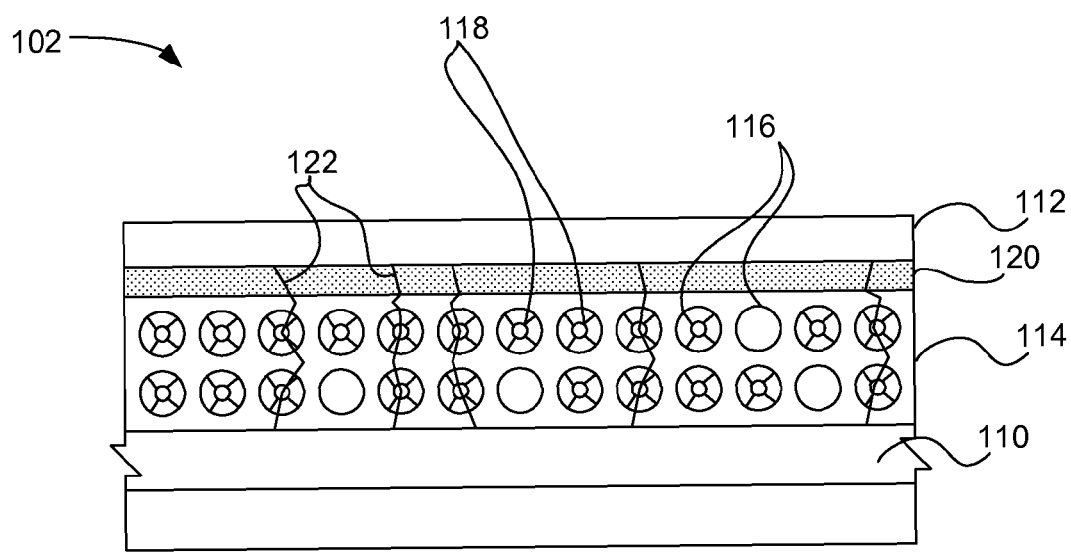
FIG. 1C illustrates a memory element including a porous layer according to some embodiments described herein.

FIG. 1C illustrates a memory element 102 including a porous layer according to some embodiments described herein. The memory element 102 includes conductive electrodes 110 and 112, and a resistive-switching layer 114. The resistive-switching layer 114 is a porous layer that is infused with a conductive vapor-based deposition precursor. The resistive-switching layer 114 (which may also be referred to as porous layer 114) can be an amorphous carbon, silicon, or carbosilicon layer that is formed with pores 116. The pores are infused with metal or semiconductor atoms 118 that create point defects in the porous layer 114. The atoms 118 are embedded in the layer 114 using conductive vapor-based deposition precursors (e.g. chemical vapor deposition (CVD) or atomic layer deposition (ALD) precursors), which are flowed into the porous layer 114 and annealed so that the atoms 118 bind to the pores 116.

The memory element 102 may also include an adhesion layer 120, which may be a denser layer comprising the same material as the porous layer 114. The adhesion layer 120 can prevent delamination of the electrode 112, which may have difficulty adhering to the porous layer 114. The memory element 102 can also include an adhesion layer between the first electrode 110 and the porous layer 114 that is deposited before the porous layer 114. As with the adhesion layer 120, an adhesion layer 114 can be a dense layer of the same material as the porous layer 114 (e.g. a denser or nonporous layer of carbon).

It is believed that a defect-mediated switching mechanism can be used to explain the resistive-switching nature of the layer 114. The layer 114 can have point defects (the atoms 118) roughly evenly distributed throughout, which form traps (electrically-active defects). The traps are filled and emptied upon the application of voltages across the memory element 102, which changes the resistance of the layer 114.

It is believed that when a set voltage (see FIG. 2A) is applied across the memory element 102, percolation paths 122 are formed across the point defects created by the atoms 118. The percolation paths increase the conductivity of the porous layer 114, reducing the resistivity and placing the memory element 102 in a low resistance state. When a reset voltage (see FIG. 2A) is subsequently applied across the memory element 102, the percolation paths 122 are destroyed, and the memory element 102 is placed in a more resistive high resistance state. It is believed that percolation paths 122 facilitate a hopping mechanism to transport charge across defects in the bulk of the resistive-switching porous layer 114, and do not form continuous charge corridors such as filaments. The concentration of the point defects in the layer 114 is low enough (e.g. less than ten atomic percent, or less than one atomic percent), that the point defects including the atoms 118 are spaced far enough from each other to not form a physical channel, but instead form a percolative path 122 using a hopping mechanism.

These mechanisms (percolation paths, hopping, etc.) may describe the operation of the memory element 102. However, the embodiments described herein are not bound to this theory, and may operate using other mechanisms or theories.

II. Memory Operation

During a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic zero (i.e., a "0" bit). If, on the other hand, the memory element has a low resistance, the memory element may be said to contain a logic one (i.e., a "1" bit). During a write operation, the state of a memory element can be changed by application of suitable write signals to an appropriate set of signal lines 104 and 106.

Figure 2A:
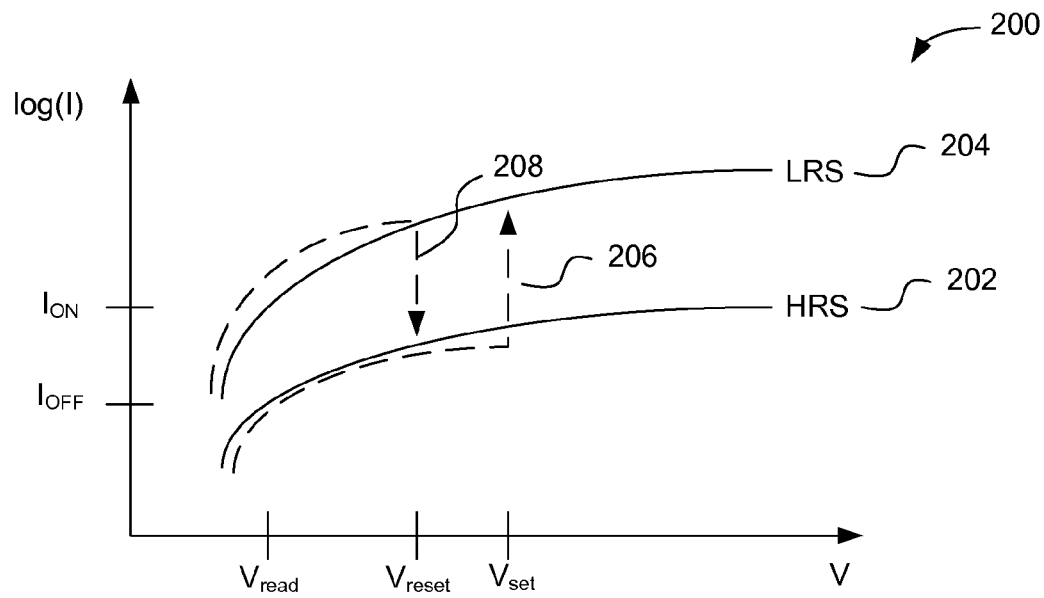
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further elsewhere, the change in the resistive state of memory element 102 may be because of the filling of traps (i.e., a may be "trap-mediated") in a resistive-switching material such as the porous layer 114.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile. As can be appreciated, it is desirable for memory element 102 to have a large difference between off current and on current (i.e., a high $I_{ON}/I_{OFF}$ ratio), which causes the on and off states of the memory element to be more discrete and easily detectable.

Figure 2B:
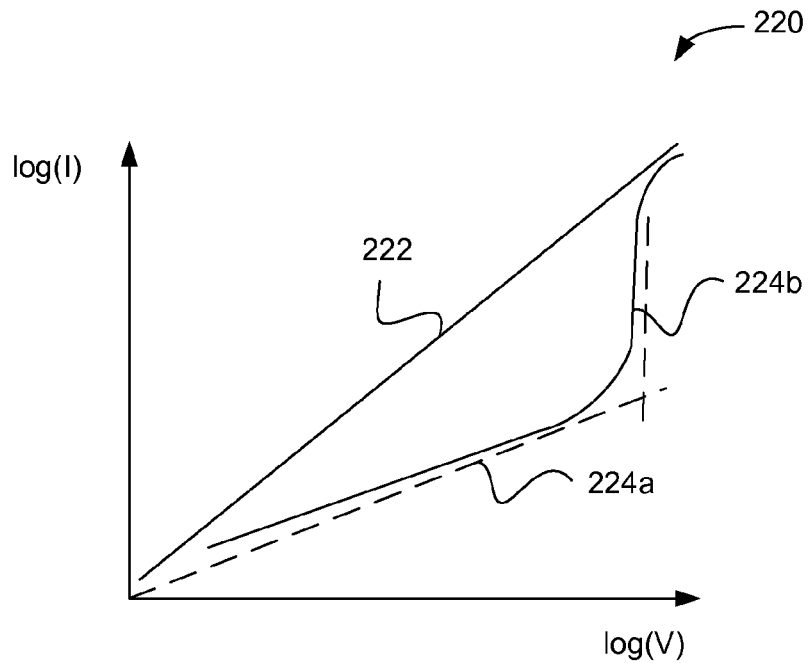
FIG. 2B is a current (I) versus voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt response like graph 224 is desired. The graph 224 begins with an Ohmic response 224a, and then curves sharply upward 224b. The graph 224 may represent a set operation, where the memory element 102 switches from the HRS 202 to the LRS 204.

Without being bound by theory, the percolation paths 122 are formed during a set operation and broken during a reset operation. For example, during a set operation, the memory element 102 switches to a low resistance state. The percolation paths 122 that are formed by filling traps increase the conductivity of the layer 114, thereby reducing (i.e., changing) the resistivity. The voltage represented by 224b is the set voltage. At the set voltage, the traps are filled and there is a large jump in current as the resistivity of the layer 114 decreases.

The set voltage 224b shown here is very discrete (i.e., vertical), which is desirable to ensure the switching of the memory element occurs at a repeatable voltage. Additionally, a high ratio of on current to off current (i.e., a high $I_{ON}/I_{OFF}$ ratio), for example 10 or greater, is desirable because it indicates a large difference in the resistivity of the layer 114 when in the HRS and LRS, making the state of the memory element easier to determine. Finally, it is desirable to have low set, reset, and switching voltages in order to avoid damage to the memory elements and to be compatible with complementary device elements such as diodes and/or transistors in series with the memory element 102.

Switching operation can be unipolar or bipolar. For example, using bipolar switching, $V_{SET}$ and $V_{RESET}$ have opposite polarity with respect to a common electrical reference (e.g. a ground). $V_{SET}$ may be negative while $V_{RESET}$ is positive, or $V_{SET}$ may be positive while $V_{RESET}$ is negative. Using unipolar switching, $V_{SET}$ and $V_{RESET}$ have the same polarity with respect to a common electrical reference, for example $V_{SET}$ and $V_{RESET}$ could both be positive or $V_{SET}$ and $V_{RESET}$ could both be negative.

III. Switching Mechanism

It is believed that the memory element 102 uses a switching mechanism that is mediated in the bulk of the resistive-switching layer 114. In one embodiment, the switching mechanism uses percolative paths 122 rather than filamentary or metallic conductive paths. Generally, conductive or semi-conducting point defects can be created by flowing a conductive vapor-based deposition precursor into a porous layer. Defects may take the form of variances in charge in the crystal structure of the layer. For example, defects can be introduced into an otherwise neutral layer by adding charged particles (e.g. $Hf^{4+}$ ions) to create charge imbalances. These defects can be traps, or electrically active defects. By applying a voltage to the memory element 102, the traps, can either be filled or emptied (i.e. trapped or de-trapped) to alter the resistivity of the resistive-switching layer and resistive switching memory elements can be formed using these principles.

The techniques described herein allow the point defects to be spatially distributed throughout the layer 114. For example, the pores of the layer 114 are designed and the precursor molecule used to create the point defects are chosen to form a layer having a relatively even distribution of defects or traps throughout the layer. The pores 116 can be designed to have an average size that approximates the size of the precursor molecule (e.g. ~3 nm). Additionally, the atoms 118 of the point defects can be a relatively small amount of the layer 114, for example less than 10 atomic percent of the layer, or less than 1 atomic percent of the layer 114. The pores 116 additionally can be numerous enough so that when the precursor molecule is flowed (i.e. diffused) into the porous layer 114, the precursor molecule is able to flow from the surface of the layer 114 (into which the precursor molecule is introduced) to the bottom of the layer 114. Additionally, the pores 116 are small enough that the molecules do not contact each other and do not begin reacting with each other.

It is further believed that because the layer 114 operates using a bulk-switching mechanism, the layer 114 is scalable. In other words, programming voltages decrease with a decrease in the thickness of the layer 114.

IV. Process for Forming Resistive-Switching Memory Element

A. Formation of Memory Element Generally

Figure 3A:
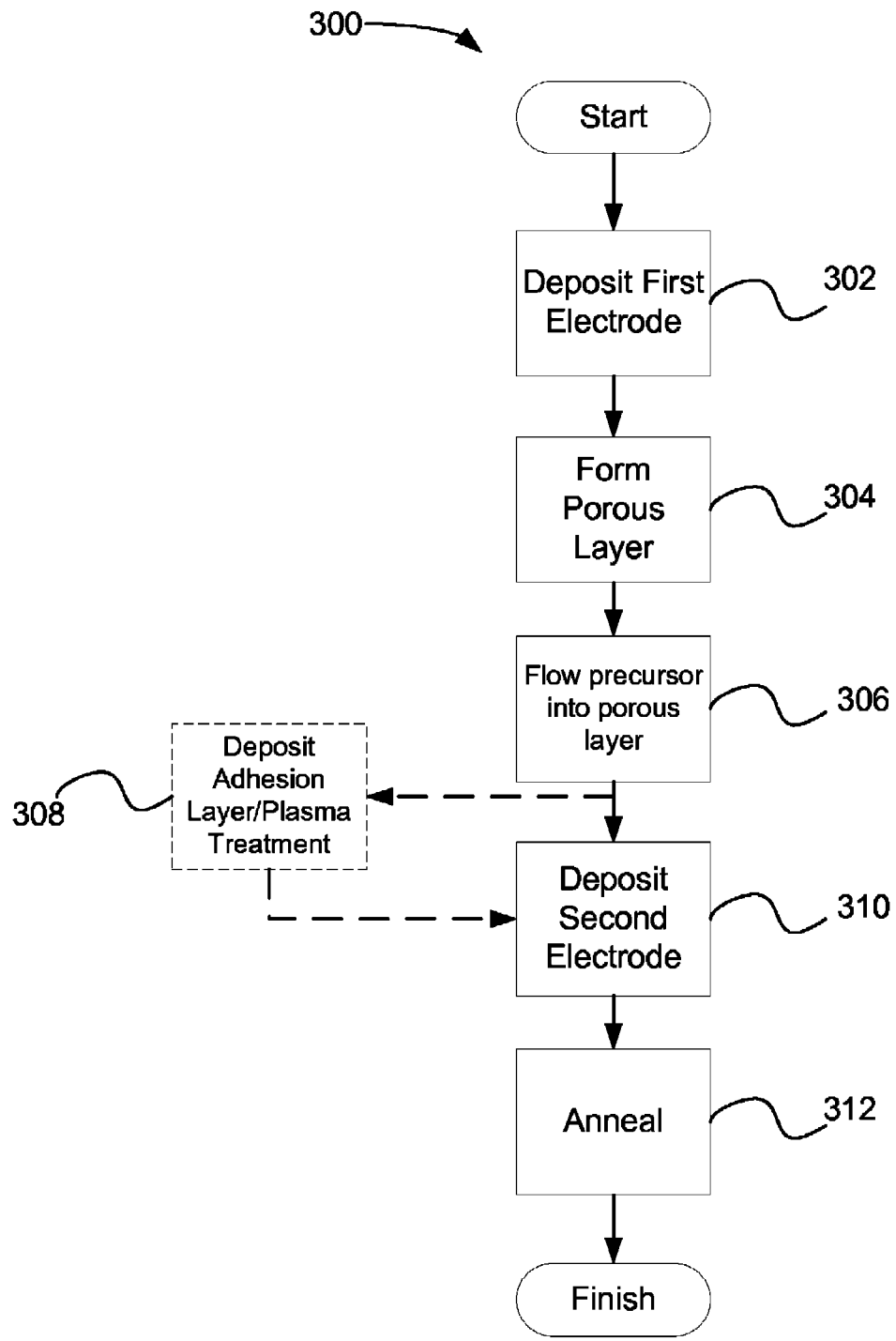

FIGS. 3A-3C are flowcharts describing a process 300 for forming a resistive-switching memory element 102 including a insulating porous layer having a conductive precursor dispersed throughout. FIGS. 4A-4G illustrate the formation of the memory element 102 using the process 300.

Figure 4A:
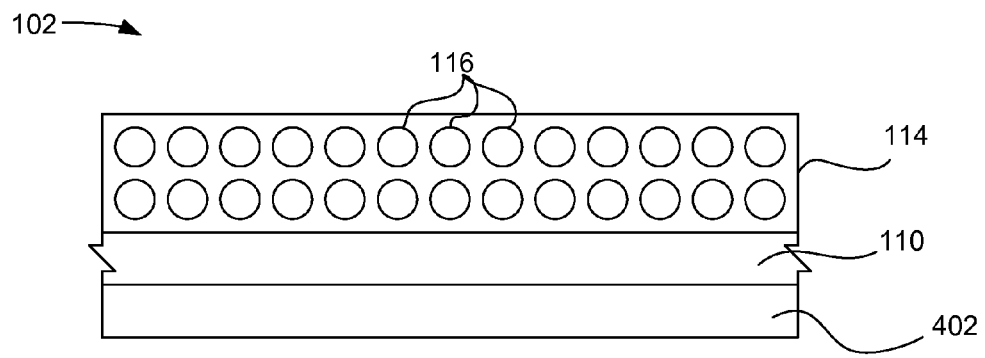
FIGS. 4A-4G illustrate the formation of the memory element using the process of FIGS. 3A-3C.

In operation 302, a first electrode is deposited on a substrate. FIG. 4A illustrates the first electrode 110 deposited on a substrate 402. The substrate 402 can be, for example, a silicon or other substrate, and may include other components, such as bit lines and word lines. The first electrode 110 can be a conductive material such as platinum, ruthenium, ruthenium oxide, iridium, or iridium oxide. Additionally, the first electrode 110 could be a transition metal such as nickel, a transition metal nitride such as titanium nitride, doped silicon, doped polysilicon, etc. The first electrode 110 can be deposited using any known deposition technique, including dry techniques (e.g. CVD, ALD, PVD) and wet techniques (ELD, ECD, and spin-on techniques). In some embodiments, an adhesion layer (not shown) can be deposited over the first electrode 110 to adhere to the porous layer 114.

In operation 304, a porous layer is formed. The porous layer 114 is shown in FIG. 4A. The porous layer 114 has several pores 116 which have an average size that is approximately equal to the precursor molecules that are flowed into the porous layer 114. For example, the precursor molecules flowed into the layer may be an organometallic precursor (e.g. tetrakis (dimethylamido) hafnium (TDMAH), tetrakis (diethylamido) titanium (TDEAT), tetrakis (dimethylamino) titanium (TDMAT)) that has a molecule size of approximately 3-5 nm. Therefore, in some embodiments, the size of the pores may be less than 10 nm, less than 5 nm, less than 3 nm, approximately 3 nm, 3-5 nm, etc. When the bonds of the precursor molecule are reacted (see FIGS. 4E-4F), the central atom remains.

Additionally, the porosity of the layer 114 can be sufficient to allow the precursor molecules to distribute throughout the layer 114, for example allowing some precursor molecules to settle near the bottom of the layer 114. When the precursor molecule is flowed into the layer 114, the layer 114 is porous enough that the precursor molecules will flow to the bottom, and "stack" throughout the layer as more precursor is flowed (see FIG. 4D).

Figure 4B:
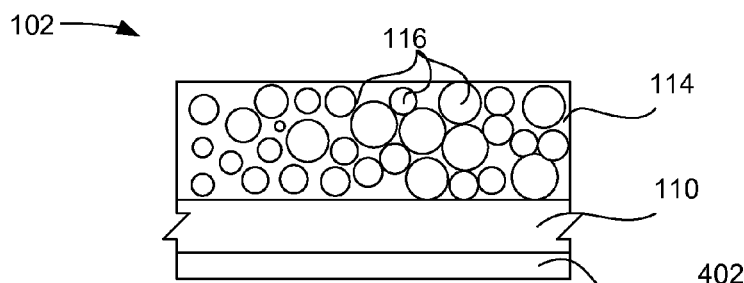

Although the layer 114 is shown in FIG. 4A having a relatively even distribution of pores 116, it is understood that the layer can have different sized pores 116 that are distributed throughout the layer 114, as shown in FIG. 4B. In some embodiments, the layer 114 can have pores 116 having an average size (e.g. 3-5 nm) that is able to absorb the selected precursor molecule.

The layer 114 can be formed using one or more of several techniques. For example, the layer can be formed using CVD, plasma enhanced CVD (PECVD) (see process 304-1 of FIG. 3B), spin-on deposition (see process 304-2 of FIG. 3C), etc. In some embodiments, the layer 114 can be deposited using PECVD with a precursor mixture including a hydrocarbon precursor and a non-oxidative carrier gas. The hydrocarbon can be, for example a $C_mH_n$-type hydrocarbon such as acetylene or propylene to deposit a carbon porous layer, and the non-oxidative gas could be hydrogen, ammonia, or helium. The non-oxidative gas can be used to strike a plasma for a PECVD process. Alternatively, a material having the general formula $Si_xC_yH_z$ can be used to deposit a carbon layer, a silicon layer, or a layer containing both carbon and silicon. In other examples, a silicon oxide layer can be deposited.

Figure 4C:
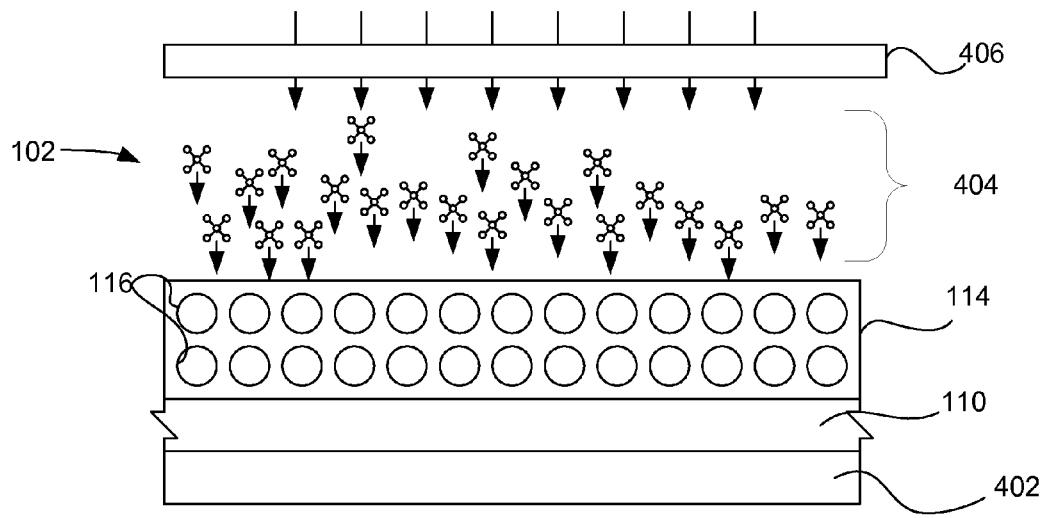
Figure 4D:
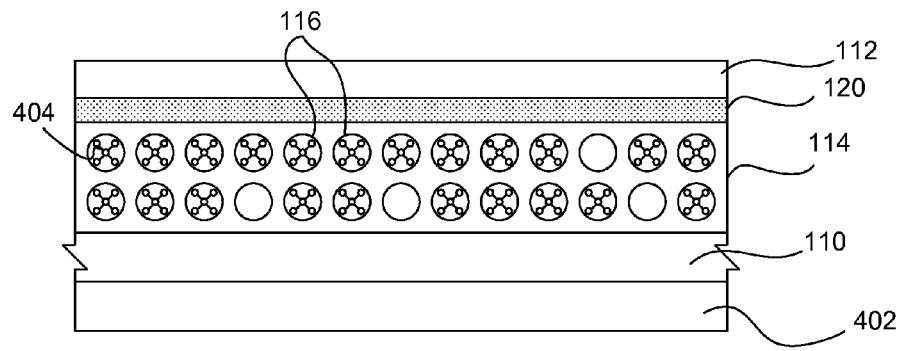

In operation 306, a precursor is flowed into the porous layer 114. FIG. 4C illustrates flowing a precursor molecule 404 containing a conductive element 118 into the porous layer 114. For example, the precursor can be a conductive vapor-based deposition precursor such as those used ALD or CVD processes. The precursor can be a metallic precursor such as a Ni, Hf, Ti, Zr, or other metal-containing precursor, and can be any type of molecule, such as halides (e.g. $HfCl_4$) or organometallics (e.g. TEMAH, TDEAT, TDMAT). In other embodiments, the precursor could be a semiconductor-containing precursor such as a Si- or Ge-containing precursor. The precursor molecules 404 can be flowed into the porous layer 114 using standard deposition hardware such as a showerhead 406 in a deposition chamber or a batch reactor (not shown). FIG. 4D shows the precursor molecules 404 having settled into the pores 116 of the porous layer 114.

In operation 308, an optional adhesion layer 406 (shown in FIG. 4D) is deposited over the porous layer 114. In some embodiments, the second electrode 112 may have difficulty adhering to the porous layer 114 because the porosity of the layer 114 provides a smaller surface area for the electrode 112 to attach to. The adhesion layer 120 can be, for example, a denser or nonporous layer of the same material as the porous layer 114. In another embodiment, the porous layer 114 can also or alternatively be treated using a plasma treatment, which can increase the density of the surface of the layer 114 and improve adhesion of the electrode 112.

In operation 310, a second electrode 112 (shown in FIG. 4D) is deposited on the porous layer 114 or on the optional adhesion layer 120. If the porous layer 114 is carbon, for example, the second electrode can be a material that forms a carbide bond such as a Ti, Ta, W, or other refractory-metal based material. These materials may be refractory metals, refractory metal carbides, or refractory metal nitrides. These materials can generally have the formula $Me_xC_y$ (e.g. $Ti_xC_y$, $W_xC_y$, $Ta_xC_y$) or $Me_xC_yN_z$ (e.g. $Ti_xC_yN_z$, $W_xC_yN_z$, $Ta_xC_yN_z$). The carbide bond improves adhesion of the second electrode 112. Additionally or alternatively, the second electrode 112 could include Si, which can also bond to C. For example, the second electrode could be a doped-Si layer (e.g. doped polysilicon) or a Si-containing layer having a general formula $MeSi_xC_yN_z$ (e.g. Me can be Ti, Ta, W, or another refractory metal).

The second electrode 112 can be deposited using a vapor based method such as ALD or CVD, so that the precursor used to form the second electrode 112 can diffuse into the porous layer 114. In some embodiments the second electrode 112 could contain the same metal or semiconductor as in the infusing precursor 404, for example the infusing precursor 404 could be a Ti precursor and the second electrode 112 could be TiN.

Figure 4E:
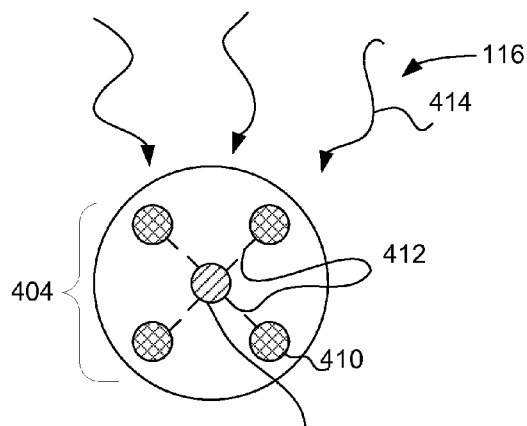
Figure 4F:
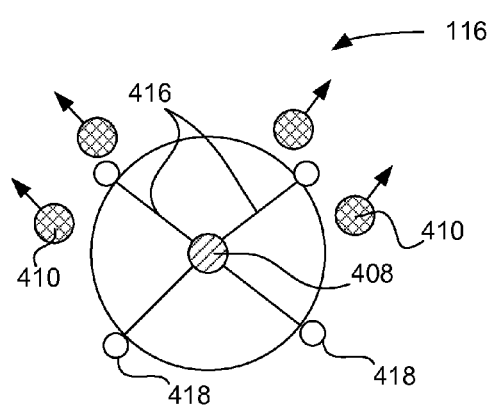

In operation 312, the memory element 102 is annealed. FIGS. 4E and 4F show the effects of annealing a precursor molecule 404 in a pore 116 of the memory element 102. As shown in FIG. 4E, the precursor molecule 404 includes a metal or semiconductor atom 408 (e.g. Hf, Ti, Si) surrounded by volatile compounds 410 (e.g. halogens or hydrocarbons) that react with other reagents to form a metal, metal oxide, etc. layer during a typical ALD or CVD deposition. The temperature of the anneal is sufficient to break the bonds 412 between the atom 408 and the volatile compounds 410. In FIG. 4F, the volatile compounds 410 are evacuated from the pore 116 and the layer 114, and the thermal energy 414 causes the atom 408 to form bonds 416 with the atoms 418 of the layer 114. Alternatively, a UV cure can be used in addition to or in place of the anneal.

Figure 4G:
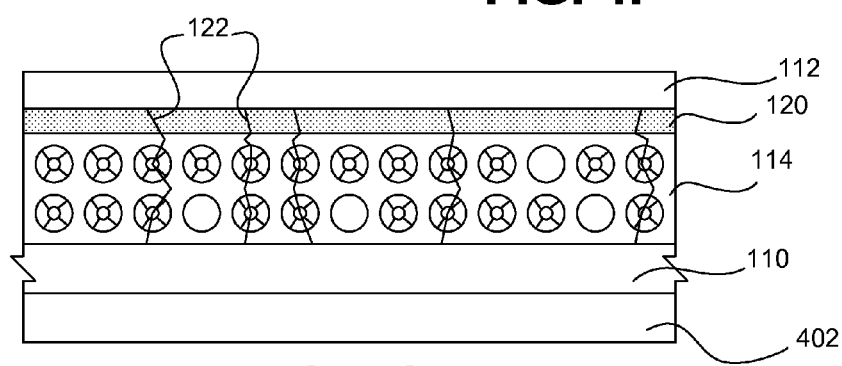

Once the memory element 102 has been annealed in operation 312, the process 300 is finished, and the resistive-switching memory element 102 including the porous layer 114 is complete, as shown in FIG. 4G. Upon the application of a set voltage, for example, percolative paths 122 can be formed through the layer 114 to reduce the resistance (i.e. change from the HRS to the LRS) of the layer 114 and thereby change the state of the memory element 102.

B. Formation of Porous Layer

Figure 5A:
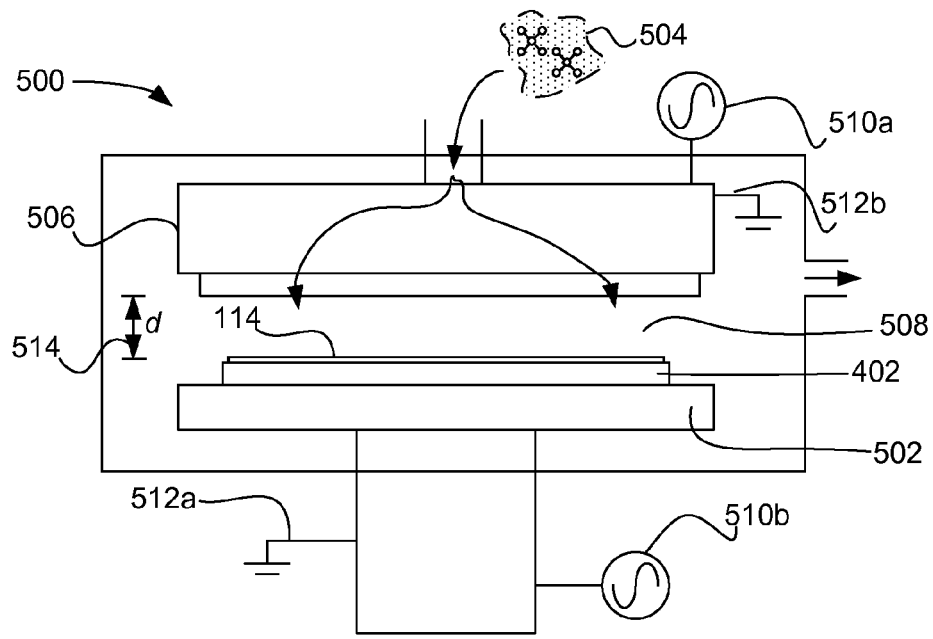
FIG. 5A illustrates a PECVD chamber for depositing a porous layer.
Figure 5B:
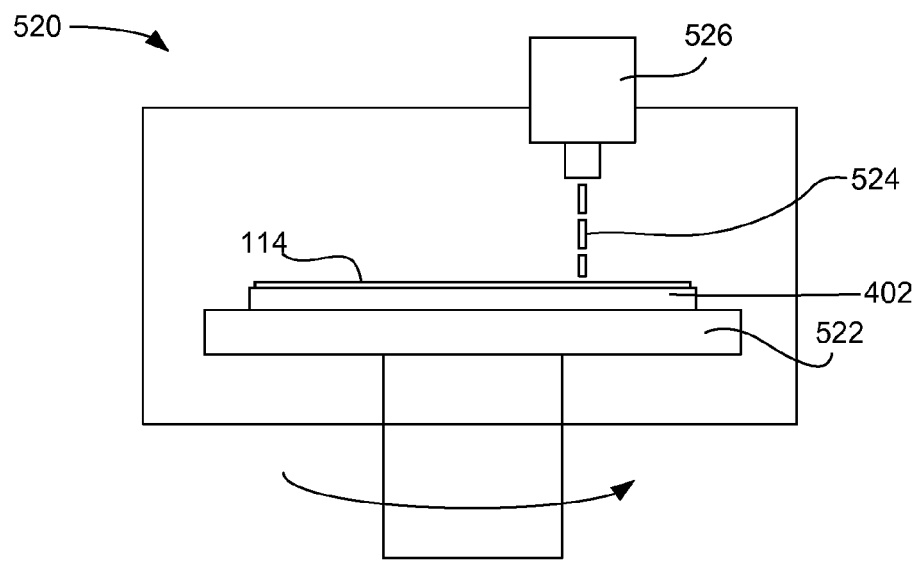
FIG. 5B illustrates a spin-on chamber for depositing porous layer.

The formation of the porous layer in operation 304 is shown in more detail in FIGS. 3B, 3C, 5A and 5B. FIG. 3B is a flowchart describing a process 304-1 for depositing the porous layer 114, and FIG. 3C is a flowchart describing an alternative process 304-2 for depositing the porous layer 114. The processes 304-1 and 304-2 describe two techniques for depositing an amorphous, porous insulating or semiconductor layer; it is understood, however, that various other processes can also be used, and that variations of the described processes 304-1 and 304-2 can also be used. The process 304-1 describes using PECVD to deposit the porous layer 114, and the process 304-2 describes using a spin-on process to deposit the porous layer 114. FIG. 5A illustrates a PECVD chamber 500 for depositing the porous layer 114, and FIG. 5B illustrates a spin-on chamber 520 for depositing the porous layer 114.

1. Formation of Porous Layer Using PECVD

PECVD is a technique for depositing thin films from a precursor delivered in a gas phase. A PECVD chamber 500 illustrated in FIG. 5A can be used to deposit the porous layer 114. The PECVD chamber 500 includes a pedestal 502 on which the substrate 402 is mounted. The porous layer 114 is formed upon the substrate 402; the other layers deposited beneath the porous layer 114 are not shown to simplify the figure.

Several techniques are described herein to tailor the porosity of the layer 114. The pressure of the chamber can be changed, a porogen-containing precursor can be used, the power used to strike a plasma, and the showerhead-substrate distance can be modified. The porogen can be, for example, an organic porogen, a silane-derived porogen, or a polymer-based porogen. The desired porosity depends on the infusing precursor 404 that is to be flowed into the porous layer 114, and these variables can be modified to provide a tailored pore size. Additionally, energetic treatments of the porous layer, for example UV curing or plasma treatments, can affect the porosity of the layer.

A CVD precursor mixture 504 for depositing the layer 114 is flowed into a showerhead 506, which distributes the precursor throughout the chamber 500 to grow the porous layer 114. The precursor mixture also includes a nonoxiditive carrier gas (e.g. Ar, He, $H_2$, $NH_3$, or mixtures thereof) that can be used to ignite a plasma in the region 508 between the pedestal 502 and the showerhead 506. The plasma can be ignited by using a direct current (DC) or radiofrequency (RF) power source 510a attached to the showerhead 506 or a power source 510b attached to the pedestal 502. A ground 512a or a ground 512b is connected to the pedestal 502 or the showerhead 506, respectively, to complete the circuit in the chamber 500. Alternatively, a voltage difference can be created between the showerhead 506 and the pedestal using any known techniques.

In some embodiments, the distance d 514 between the porous layer 114 and the showerhead 506 (the showerhead-substrate spacing) can influence the porosity of the layer. The exact amount of spacing depends on the chamber design, but in some examples, the distance d can be on the order of 30 cm. In general, increasing the distance d increases the porosity of the layer.

Although a PECVD chamber is described here, it is understood that other types of CVD chambers can also be used. Additionally, other chamber configurations can be used. For example, the CVD chamber may not use a showerhead for precursor distribution, and may instead use injectors or other similar devices.

The process 304-1 generally describes using the PECVD chamber 500 to deposit the porous layer 114. After the first electrode is deposited in operation 302, a plasma is generated in the chamber 500 in operation 342. The plasma can be, for example, an ex situ plasma, which generated externally and introduced into the chamber 500, or can be an in situ plasma that is generated inside the chamber 500 by introducing a plasma gas (e.g. $H_2$, Ar, $N_2$, etc.) into the region 508 and introducing a voltage between the showerhead 506 and the pedestal 502 to strike the plasma using the power supplies 510 and the grounds 512 to supply the voltage. The power used to generate a plasma in the chamber 500 can affect the porosity of the layer. Depending on the precursor used to form the layer 114, increasing the power can increase or decrease porosity, for example.

In operation 344, a precursor for depositing the layer 114 is introduced into the chamber 500. The precursor can be introduced through the showerhead 506 using a CVD precursor mixture 504, which includes a precursor and a carrier gas. The precursor may be, for example, a precursor having a composition of $Si_xC_yH_z$. In some embodiments, x=0 and the precursor is a hydrocarbon such as propylene or acetylene, to form a porous carbon layer. In some embodiments y=0, and the precursor can be, for example, a silane, to form a porous silicon layer. In other embodiments, x and y can have other values, so that the porous layer 114 has some mixture of silicon and carbon.

The CVD precursor mixture 504 includes a carrier gas such as a He/Ar mixture, which can comprise any amount of the mixture 504. For example, the carrier gas may be between 0 and 90% of the mixture 504, and increasing the amount of carrier gas can make the pores 116 of the porous layer 114 more uniform to facilitate the deposition of the porous layer 114. The carrier gas can be used to strike a plasma in the chamber 500. The existence of a plasma in the chamber 500 generally depends on the type of gas used, the showerhead 506-pedestal 502 spacing, and the voltage applied.

In some embodiments, the CVD precursor for the layer 114 may additionally include a porogen, which is a sacrificial functional group that is preliminarily bound to the deposited film, but subsequently can be removed by energetic (e.g. UV or heat exposure) treatment. A porogen can create additional porosity, or can be used to tailor the porosity of the porous layer 114. In some embodiments, a porogen-containing precursor can deposit a porous layer 114 that is more porous than can be deposited otherwise.

In operation 346, the pressure of the PECVD chamber 500 is adjusted to tailor the porosity and other characteristics of the porous layer 114. For example, the pressure can be increased to reduce the crystallinity of the layer 114 and create an amorphous film. Additionally, increased pressure can reduce the density of the layer 114, which in turn increases the porosity. The actual pressure of the chamber depends on the chamber design; for example, in a chamber 500 where the substrate-showerhead distance d 514 between the showerhead 506 and the substrate 402 is 30 cm, the amount of pressure used may be between 2-8 Torr. It is understood, however, that factors other than the substrate-showerhead spacing may influence the amount of pressure used, including chamber volume and shape.

It is understood that the operations 342, 344, and 346 can be performed in any order, and may be performed simultaneously, depending on the specifics of the layer 114 to be deposited and the chamber being used.

In operation 348, if the precursor includes a porogen, the layer 114 can be cured to remove the porogen from the as-deposited layer and create additional pores. The curing can be performed by techniques such as exposing the layer 114 to UV radiation 350 (e.g. with a wavelength of 170-400 nm) or using thermal cures such as anneals 352 or a laser anneal 354. The curing can be done in a controlled environment such as a vacuum environment, a reducing environment containing $H_2$, or an environment containing an inert gas. Additionally, an elevated substrate temperature (e.g. 300-450°) can also be used. Other curing treatments may involve the use of heat, ionizing species, or the generation of catalytic species. When the process 304-1 is complete, the process 300 proceeds to operation 306.

2. Formation of Layer Using Spin-on Deposition

FIG. 5B illustrates a spin-on deposition chamber 520 that can be used to form the porous layer 114. The spin-on deposition chamber 520 includes a rotatable pedestal 522 onto which the substrate 402 is mounted. A spin-on material 524 is dispensed using dispenser 526 while the pedestal 522 rotates. The rotation of the pedestal 522 distributes the spin-on material 524 over a surface of the substrate 402 to create the porous layer 114.

The process 304-2 describes depositing the layer 114 using spin-on deposition in the chamber 520. After the first electrode is deposited in operation 302, the pedestal 522 is rotated to rotate the substrate in operation 362. In operation 364, the spin-on material 524 is dispensed using dispenser 526. In one embodiment, the spin-on material 524 is a SiCOH-based molecule that includes a porogen. The SiCOH material may optionally not include Si (to deposit a C layer) or not include C (to deposit an Si layer). The porogen is a sacrificial group that is removed in operation 366 when the layer 114 is cured. The layer can be cured using one or more of a UV cure 368, a thermal cure 370, or a laser anneal 372, which are similar to the processes 350-354 described above.

Energetic processes remove the porogen-containing functional groups from the matrix, and pores are created. The pores can have varying sizes depending on the size of the functional group, but may be between 1-1000 Å, for example. When the process 304-2 is complete, the process 300 proceeds to operation 310.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a nonvolatile memory element, the method comprising:
    depositing a first electrode on a substrate;
    depositing a layer on the first electrode using a porogen-containing precursor,
        wherein the porogen-containing precursor comprises a porogen;
    exposing the deposited layer to a vapor-based deposition precursor,
        wherein the vapor-based deposition precursor comprises one of Hf, Ti, Ru, or Ni,
        wherein, after exposing the deposited layer to the vapor-based deposition precursor, the deposited layer comprises a plurality of conductive point defects embedded in a plurality of pores of the deposited layer, and wherein the plurality of conductive point defects comprises the one of Hf, Ti, Ru, or Ni; and
    depositing a second electrode over the deposited layer,
        wherein the nonvolatile memory element is configured to switching between a high resistive state and a low resistive state.

2. The method of claim 1, wherein the porogen comprises an organic porogen, a silane-derived porogen, or a polymer-based porogen.

3. The method of claim 1, further comprising treating the deposited layer a treatment to remove the porogen before exposing the deposited layer to the vapor-based precursor.

4. The method of claim 3, wherein the treatment comprises a UV cure or a heat exposure treatment.

5. The method of claim 1, wherein the porogen-containing precursor further comprises a hydrocarbon and a nonoxidative gas.

6. The method of claim 1, wherein depositing the layer comprises using at least one of chemical vapor deposition (CVD), plasma-enhanced CVD (PECVD), spin-on deposition, and atomic layer deposition (ALD).

7. The method of claim 1, further comprising annealing the nonvolatile memory element, wherein annealing comprises annealing at a temperature sufficient to decompose the vapor-based precursor.

8. The method of claim 1, further comprising depositing an adhesion layer before depositing the second electrode, wherein the adhesion layer has a first density greater than a second density of the deposited layer.

9. The method of claim 1, wherein, prior to exposing the deposited layer to the vapor-based deposition precursor, the deposited layer comprises at least one of an insulating material or a semiconductor material.

10. The method of claim 9, wherein the insulating material of the deposited layer comprises an amorphous carbon.

11. The method of claim 1, wherein, prior to exposing the deposited layer to the vapor-based deposition precursor, the deposited layer comprises pores.

12. The method of claim 11, wherein a size of the pores of the deposited layer is less than 10 nanometers.

13. The method of claim 11, wherein a size of the pores of the deposited layer is less than 5 nanometers.

14. The method of claim 11, wherein exposing the deposited layer to a vapor-based deposition precursor comprises introducing the vapor-based deposition precursor into the pores of the deposited layer.

15. The method of claim 11, wherein the pores are distributed throughout an entire volume of the deposited layer.

16. The method of claim 1, wherein the vapor-based deposition precursor is one of tetrakis (dimethylamido) hafnium (TDMAH), tetrakis (diethylamido) titanium (TDEAT), or tetrakis (dimethylamino) titanium (TDMAT).

17. The method of claim 1, further comprising, prior to depositing second electrode, treating the deposited layer using plasma to improve density of the deposited layer at least at an interface with the second electrode.

18. The method of claim 1, wherein the second electrode comprises one of $Ti_xC_y$, $W_xC_y$, $Ta_xC_y$, $Ti_xC_yN_z$, $W_xC_yN_z$, or $Ta_xC_yN_z$.

19. The method of claim 1, wherein the vapor-based deposition precursor comprises Hf.

* * * * *